United States Patent
Chen et al.

(10) Patent No.: US 7,791,420 B2
(45) Date of Patent: Sep. 7, 2010

(54) PHASE-LOCKED LOOP WITH START-UP CIRCUIT

(75) Inventors: Chien-Hung Chen, Taipei (TW);
Mao-Hsuan Chou, Hsin-Chu (TW);
Tsung-Hsien Tsai, Hsin-Chu (TW);
Min-Shueh Yuan, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 85 days.

(21) Appl. No.: 12/330,952

(22) Filed: Dec. 9, 2008

(65) Prior Publication Data

US 2010/0141346 A1 Jun. 10, 2010

(51) Int. Cl.
*H03K 3/03* (2006.01)
*H03L 7/099* (2006.01)
(52) U.S. Cl. .......................... 331/57; 331/172; 331/185
(58) Field of Classification Search .................... 331/57, 331/160, 172–174, 185
See application file for complete search history.

(56) References Cited

U.S. PATENT DOCUMENTS

| | | | |
|---|---|---|---|
| 5,945,856 A | 8/1999 | Yanagiuchi | |
| 5,955,928 A | 9/1999 | Smith et al. | |
| 6,275,116 B1 * | 8/2001 | Abugharbieh et al. | 331/34 |
| 6,396,357 B1 * | 5/2002 | Sun et al. | 331/57 |
| 7,023,250 B2 | 4/2006 | Chen | |
| 7,659,783 B2 * | 2/2010 | Tai | 331/17 |
| 7,679,467 B2 * | 3/2010 | Hirata et al. | 331/185 |

OTHER PUBLICATIONS

Van Roon, T., "Phase-Locked Loops," (online) http://www.uoguelph.ca/~antoon/gadgets/pll/pll.html, last updated Apr. 13, 2006, 10 pgs.

* cited by examiner

*Primary Examiner*—Robert Pascal
*Assistant Examiner*—Levi Gannon
(74) *Attorney, Agent, or Firm*—Slater & Matsil, L.L.P.

(57) ABSTRACT

A circuit includes a voltage-controlled oscillator (VCO), which includes a voltage input node having an input voltage; and a start-up circuit. The start-up circuit includes a first current path and a second current path. The first current path has a first current and is configured so that the first current increases in response to a decrease in the input voltage and decreases in response to an increase in the input voltage. The second current path has a second current and is configured so that the second current decreases in response to the decrease in the input voltage and decreases in response to the increase in the input voltage. The VCO further includes a third current path combining a first proportion of the first current and a second proportion of the second current into a combined current; and a current-controlled oscillator (CCO) including an input receiving the combined current and outputting an AC signal.

19 Claims, 4 Drawing Sheets

PHASE-LOCKED LOOP WITH START-UP CIRCUIT

TECHNICAL FIELD

This invention relates generally to circuits, and more particularly to phase-locked loop circuits including start-up circuits, and even more particularly to phase-locked loop circuits free from gating circuits.

BACKGROUND

Phase-locked loop (PLL) circuits are widely used in integrated circuit design, such as in the design of receivers. PLL circuits are basically closed-loop frequency control systems whose functioning is based on the phase sensitive detection of the phase difference between an input signal and an output signal.

FIG. 1 illustrates a conventional PLL circuit, which includes phase frequency detector (PFD) 20, pump 22, loop filter 24, voltage-controlled oscillator (VCO) 26, feedback (FB) divider 28, and start-up circuit 32. Input signal S_in is input into the PLL circuit and an output signal S_out is generated by the PLL.

A schematic diagram of start-up circuit 32 is shown in FIG. 2. Start-up circuit 32 includes cycle-counter 34, which counts the cycles of the input signal S_in and controls a voltage Vcoin to be applied to node 36 in FIG. 1. Starting from the first cycle of the input signal, switches 38 in FIG. 2 are closed and a voltage is applied to diodes 40 so that the divided voltage Vcoin is output to node 36 in FIG. 1. Accordingly, loop filter 24, which includes capacitors, is charged and the voltage Vcoin at node 36 increases due to the charging of the capacitors. The frequency F_vco of the signal S_vco outputted by VCO 26 thus increases.

Cycle-counter 34 and the entire start-up circuit 32 are turned off after a certain number, for example, 64 cycles of the input signal S_in. At which time, the frequency F_vco of signal S_vco is at an initial frequency. It is realized that the initial frequency is affected by several factors. For example, for a 50 MHz input signal, start-up circuit 32 is turned on for 1.28 microseconds. However, when the input signal has a frequency of 10 MHz, start-up circuit 32 is turned on for 6.4 microseconds. Such a significant difference in the frequencies of the input signals causes the different lock time of PLL circuits. For example, lock time may be 1.28 microseconds or 6.4 microseconds.

Further, at the time start-up circuit 32 is turned off, the initial frequency may have already exceeded the minimum operated frequency specified by the specification. Such a high frequency thus cannot be sent out of the PLL circuit before it is decreased. Referring again to FIG. 1, gating circuit 30 is added to gate the initial frequency. Gating circuit 30 blocks the signal generated by VCO 26 from being sent out of the PLL circuit until the frequency is reduced to a target frequency. To achieve such a function, gating circuit 30 needs to compare the signal generated by VCO 26 with a reference signal having the target frequency. However, due to the phase difference between the signal generated by VCO 26 and the reference signal, gating circuit 30 may output glitches that have much narrower pulses than required.

An additional problem of the conventional PLL circuit is caused by process, voltage, and temperature (PVT) variations, which cause different PLL circuits, although having a same design, to work on different process corners, such as fast-fast (FF) corner, slow-slow (SS) corner, and the like. Even for a same input signal, the initial frequencies of circuits working at the FF corner may have exceeded the minimum operated frequency, while the initial frequencies of the circuits working at the SS corner still have frequencies well below the minimum operated frequency. To ensure that the minimum operated frequency is not exceeded, the design of the PLL circuits may be adjusted so that the initial frequencies of the circuits working at the FF corner are also below the minimum operated frequency. Unfortunately, this may cause the circuits working at the SS corner to fail to start oscillating. Therefore, the conventional PLL circuits have subtle problems difficult to overcome. New PLL circuits and new start-up circuits are thus needed.

SUMMARY OF THE INVENTION

In accordance with one aspect of the present invention, a phase-locked loop (PLL) circuit includes a voltage-controlled oscillator (VCO), which includes a voltage input node having an input voltage; and a start-up circuit. The start-up circuit includes a first current path and a second current path. The first current path has a first current, and is configured so that the first current increases in response to a decrease in the input voltage, and decreases in response to an increase in the input voltage. The second current path has a second current, and is configured so that the second current decreases in response to the decrease in the input voltage, and increases in response to the increase in the input voltage. The VCO further includes a third current path combining a first proportion of the first current and a second proportion of the second current into a combined current; and a current-controlled oscillator (CCO) including an input receiving the combined current and outputting an AC signal.

In accordance with another aspect of the present invention, a PLL circuit includes a first input node; a first output node; a loop filter comprising a second output node; and a start-up circuit. The start-up circuit includes a first current path comprising a first PMOS transistor, wherein a gate of the PMOS transistor is coupled to the second output node; and a second current path mirroring a current in the first current path. The PLL circuit further includes a third current path comprising a first NMOS transistor having a gate coupled to the second output node, wherein the second current path and the third current path are connected in parallel; a fourth current path serially connected to the second current path and the third current path; a fifth current path mirroring a current of the fourth current path; and a CCO comprising a second input node receiving a current of the fifth current path.

In accordance with yet another aspect of the present invention, a PLL circuit includes a first PMOS transistor comprising a first gate, a first drain, and a first source; a first NMOS transistor comprising a second gate coupled to the first gate, a second drain, and a second source; a second NMOS transistor comprising a third gate, a third drain coupled to the first drain and the third gate, and a third source coupled to a ground; a third NMOS transistor comprising a fourth gate coupled to the third gate, a fourth drain, and a fourth source coupled to the ground; a second PMOS transistor comprising a fifth gate, a fifth drain coupled to the fifth gate and the second drain, and a fifth source coupled to a power supply node; a third PMOS transistor comprising a sixth gate coupled to the fifth gate, a sixth drain, and a sixth source coupled to the power supply node; and a CCO comprising an input node coupled to the sixth drain.

The advantageous features of the present invention include improved reliability of the PLL circuit due to the fact that it no longer needs a start-up circuit counting the cycles of the input signal and hence is not affect by the frequency of the input signal. Further, no gating circuit is needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention and do not limit the scope of the invention.

A novel phase-locked loop (PLL) circuit and a corresponding start-up circuit are provided. The variations and the operation of the preferred embodiments are also discussed. Throughout the various views and illustrative embodiments of the present invention, like reference numbers are used to designate like elements.

Figure 1:
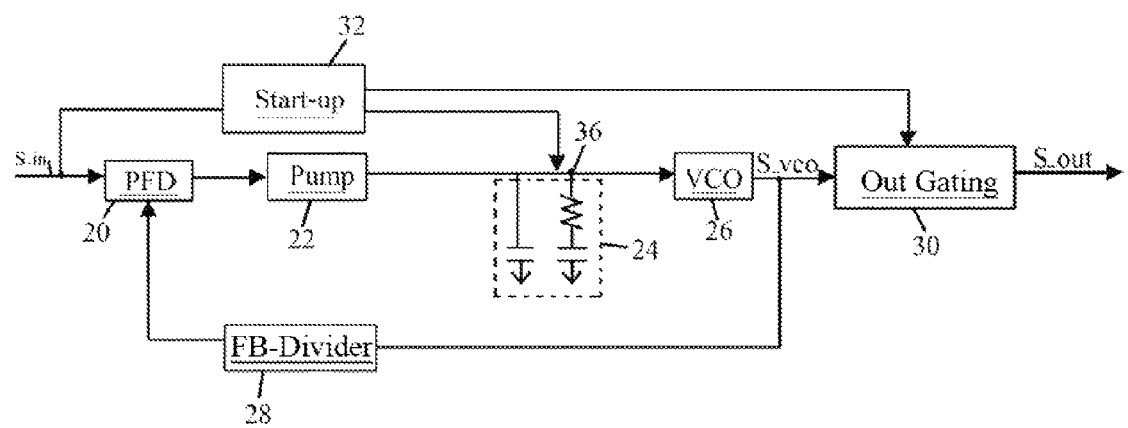
FIG. 1 illustrates a conventional phase-locked loop (PLL) circuit comprising a start-up circuit and a gating circuit.
Figure 2:
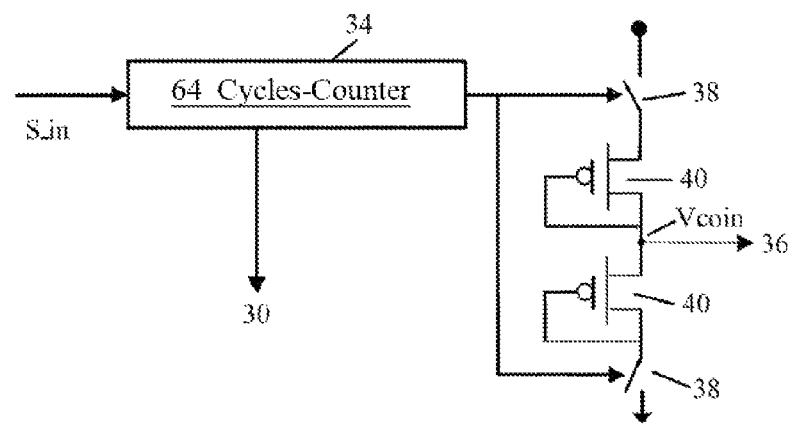
FIG. 2 illustrates the start-up circuit as shown in FIG. 1, wherein the start-up circuit comprises a cycle-counter.
Figure 3:
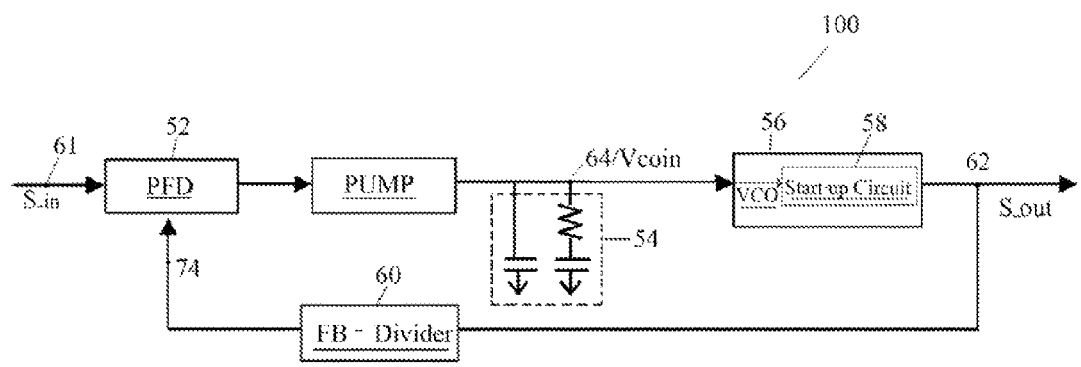
FIG. 3 illustrates a PLL circuit including a start-up circuit that does not contain a cycle-counter.

FIG. 3 illustrates a PLL circuit 100, which includes phase frequency detector (PFD) 50, pump 52, loop filter 54, voltage-controlled oscillator (VCO) 56, which includes start-up circuit 58, and feedback (FB) divider 60. Start-up circuit 58 may be a build-in circuit in VCO 56 or an external circuit. Input node 61 receives input signal S_in, which has frequency F_in. It is noted that frequency F_in can change from a minimum operated frequency to a maximum operated frequency, which frequencies are specified by the specification of the PLL circuit design. Output node 62 of PLL circuit 100 outputs signal S_out having frequency F_out. During the operation of PLL circuit 100, node 64 has voltage Vcoin, which voltage is also used to control the operation of VCO 56. Since voltage Vcoin is a voltage generated on (and/or through) loop filter 54, voltage Vcoin is also referred to as an output voltage of loop filter 54. Accordingly, node 64 is referred to as an output node of loop filter 54, although it may sometimes act as both the input node and the output node of loop filter 54.

Figure 4:
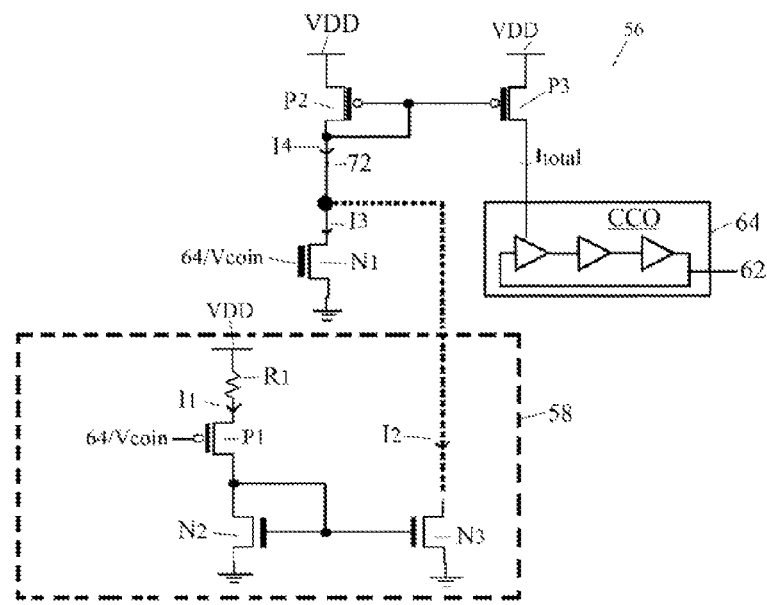
FIG. 4 illustrates an exemplary circuit diagram of the start-up circuit as shown in FIG. 3.

FIG. 4 illustrates an exemplary VCO 56 and the start-up circuit 58. VCO 56 further includes a current-controlled oscillator (CCO) 65, which receives a current generated inside VCO 56 and outputs a signal to node 62. Start-up circuit 58 has the function of, at the time voltage Vcoin is still low, generating a current that is high enough for driving CCO 65, so that the output signal S_out (FIG. 3) may be generated. When voltage Vcoin is high enough to maintain the operation of the VCO, however, start-up circuit 58 may be substantially out of operation, and the function of providing the current is taken over by other parts of PLL circuit 100.

In an exemplary embodiment, start-up circuit 58 includes resistor R1, PMOS transistor P1, and NMOS transistors N2 and N3. The gate of transistor P1 is connected to node 64, and hence has voltage Vcoin. The gate and the drain of transistor N2 are interconnected. NMOS transistors N2 and N3 have their gates interconnected with their sources coupled to a ground. Accordingly, NMOS transistors N2 and N3 form a current mirror. Current I1 flowing through transistors P1 and N2 is mirrored to current I2 flowing through NMOS transistor N3. Accordingly, current I2 is proportional to current I1. If NMOS transistor N2 and N3 have a same size, current I2 may even be equal to current I1.

The drain of NMOS transistor N3 is coupled to node 72, which is also the drain of NMOS transistor N1. The gate of NMOS transistor N1 is also connected to node 64, and hence has voltage Vcoin. NMOS transistor N1 may have current I3 flowing through it. At node 72, current I2 and current I3 are combined into current I4. Through another pair of PMOS transistors P2 and P3, current I4 is mirror to current Itotal, which is inputted into CCO 65 to generate the output signal at node 62. PMOS transistors P2 and P3 may be connected to a power supply node having a power supply voltage, for example, VDD, directly, or through resistor R1. For simplicity, in the following discussion, it is assumed that NMOS transistors N2 and N3 have the same size, and PMOS transistors P2 and P3 have the same size, and hence current I1 equals current I2, and current I4 equals current Itotal. One skilled in the art will realize that even if these transistors have different sizes, since current I2 is proportional to current I1, and current Itotal is proportional to current I4, the following discussed concept of the operations of VCO 56 and start-up circuit 58 still applies.

In the beginning of the start-up stage of PLL circuit 100, although input signal S_in is applied on input node 61 (FIG. 3), voltage Vcoin is still at 0 V. This causes PMOS transistor P1 (refer to FIG. 4) to be turned on, and a high initial current I1_init flows through transistors P1 and N2. Meanwhile, since the gate voltage of NMOS transistor N1 is less than its threshold voltage, substantially no current flows through NMOS transistor N1. Current I4 is thus substantially equal to current I1_init, and current Itotal is substantially equal to current I1_init.

The initial current Itotal, which equals current I1_init in the discussed example, is high enough to drive CCO 65 to output signal S_out with frequency F_out at node 62. The output signal is fed back to FB divider 60 (FIG. 3) so that a signal having a divided frequency is output to node 74. PFD 50 (FIG. 3) detects the difference in the phases and/or frequencies between the signals at nodes 61 and 74 and controls pump 52 to either discharge loop filter 54 to lower voltage Vcoin if the output frequency is higher than the desirable frequency (target frequency), or charge loop filter 54 to increase voltage Vcoin if the output frequency is lower than the target frequency. Since initial current I1_init is designed to ensure that the initial frequency of the output signal at output node 62 is lower than the minimum operated frequency, voltage Vcoin will always increase if PLL circuit 100 is properly designed.

Figure 5:
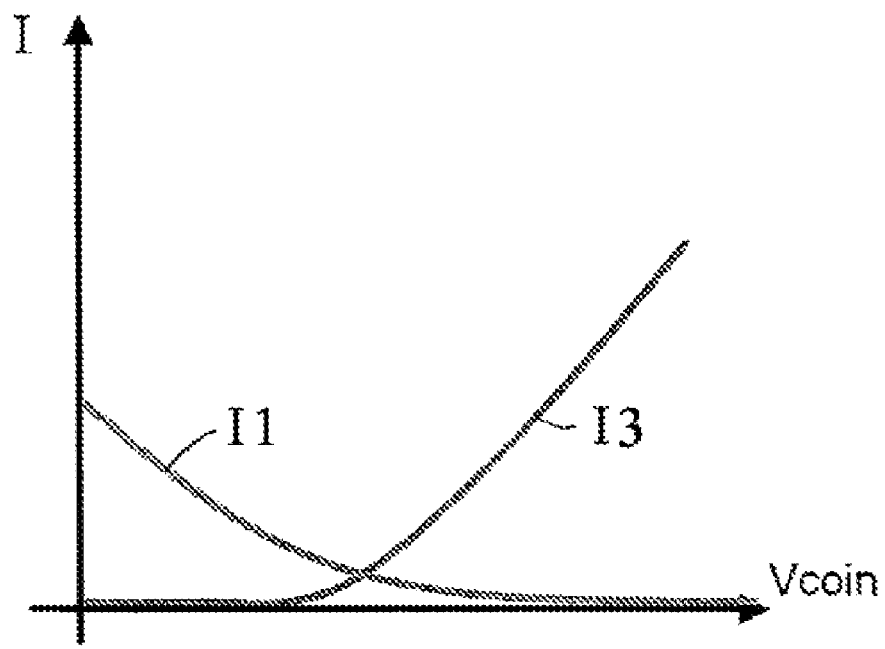
FIG. 5 illustrates currents flowing through a PMOS transistor and an NMOS transistor as a function of an input voltage of the start-up circuit.
Figure 6:
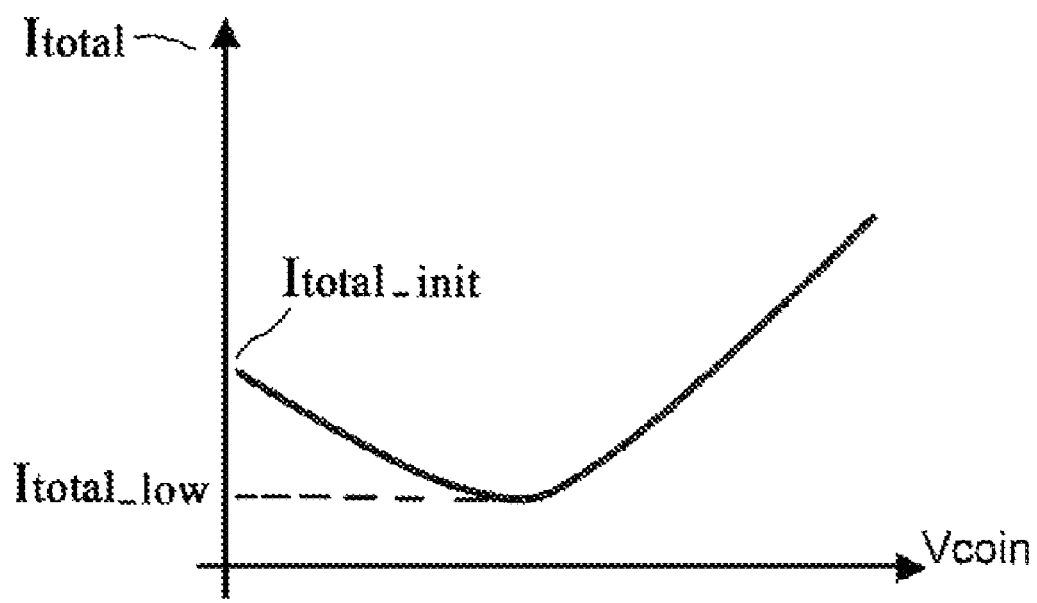
FIG. 6 illustrates a total current flowing into a current-controlled oscillator (CCO) as a function of the input voltage of the start-up circuit.

Referring again to FIG. 3, due to the feedback in the closed loop including PFD 50, pump 52, loop filter 54, VCO 56, and FB divider 60, voltage Vcoin increases, and hence current I1 decreases. In the meantime, the increase in voltage Vcoin eventually causes transistor N1 to be turned on. With time, current I3 also increases. FIG. 5 schematically illustrates the current I1 of PMOS transistor P1 and current I3 of NMOS transistor N1 as functions of voltage Vcoin. The resulting current Itotal, which equals to the summation of currents I1 and I3 in the discussed example (or equal to the summation of a proportion of current I1 and a proportion of current I3), is schematically shown in FIG. 6.

Figure 7:
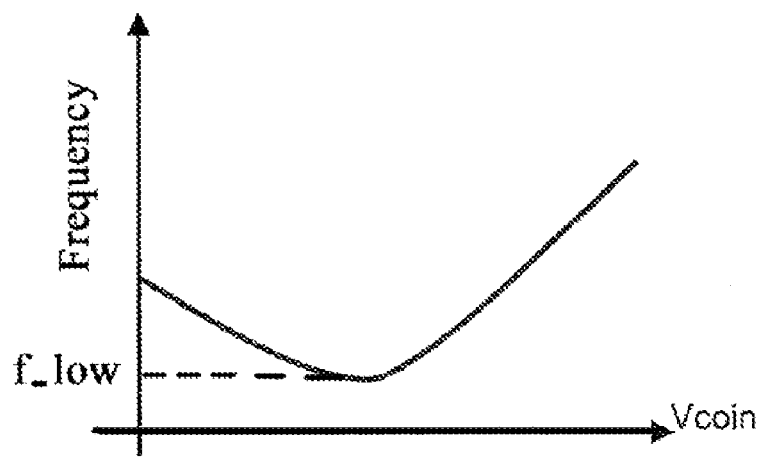
FIG. 7 illustrates a frequency of an output signal of the PLL circuit as a function of the input voltage of the start-up circuit.

During the design of start-up circuit 58 and VCO 56, two design considerations must be implemented. First, the initial frequency of the output signal S_out at output node 62 (refer to FIG. 3) should not exceed the minimum operated frequency. Accordingly, the initial total current Itotal_init (FIG. 6) flowing into CCO 65 (FIG. 4) needs to be regulated. This is implemented, for example, by adding resistor R1 (FIG. 4), and adjusting the value of R1. Second, referring to FIG. 6, with the increase in voltage Vcoin, current Itotal actually decreases before it increases again. At the point Itotal_low, the output signal S_out should not have a frequency substantially equal to 0 Hz. This requirement may be explained using FIG. 7, which shows the frequency F_out of the output signal S_out as a function of voltage Vcoin. In FIG. 7, frequency f_low should not be close to 0 Hz. Otherwise, the oscillating of CCO 65 will stop before NMOS transistor N1 is turned on and PLL circuit 100 will never be able to generate a signal having the minimum operated frequency. This requirement may be enforced by ensuring that NMOS transistor N1 is turned on before PMOS transistor P1 is turned off. Further, it is desirable that at the time PMOS transistor P1 is turned off, NMOS transistor N1 already has a current high enough for the operation at all process corners.

Figure 8:
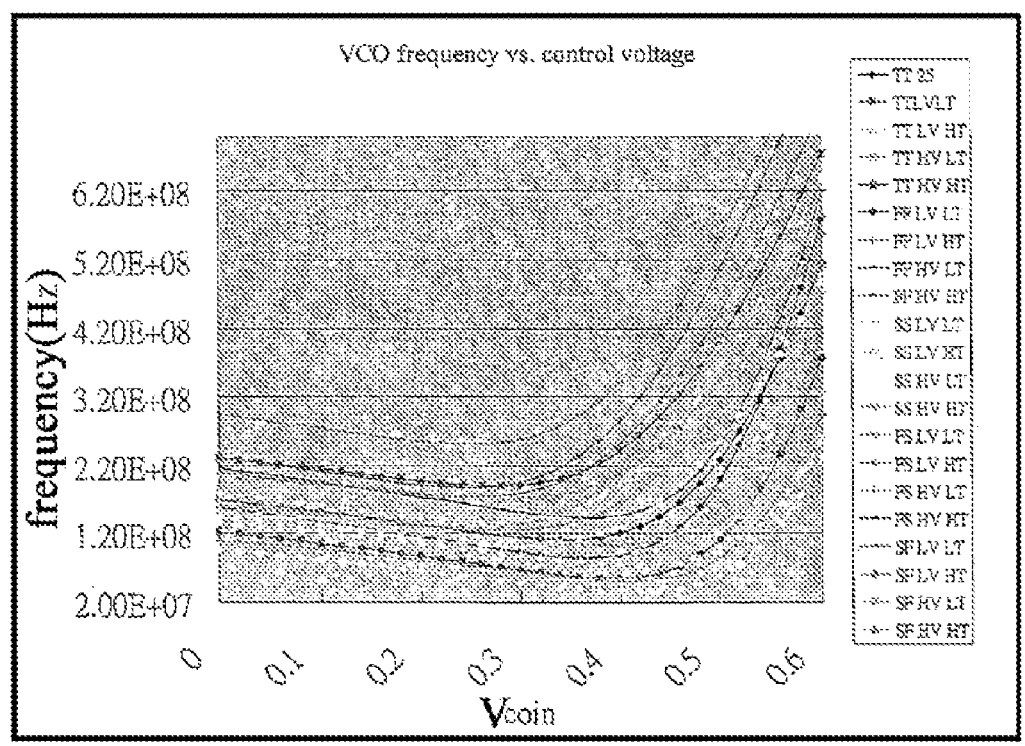
FIG. 8 illustrates simulation results of the present invention, wherein a plurality of simulations are made for different process corners.

Advantageously, the embodiments of the present invention use a start-up circuit to generate an initial current, instead of charging up an initial voltage, to start up the PLL circuit. Since the start-up circuit no longer counts the number of cycles in the input signal S_in, it is not affected by the frequency F_in of input signal S_in. Further, simulation results have indicated that the embodiments of the present invention are less affected by the process, voltage, and temperature (PVT) variations. In a simulation, a PLL circuit formed using 65 nm technology is provided with input signals having frequencies ranging from 500 MHz to 1000 MHz. The simulation results are shown in FIG. 8, which reveals that for all PVT process corners, the maximum initial frequency is about 300 MHz, which is lower than the minimum operated frequency of 500 MHz. Accordingly, no gating circuit is required. The minimum initial frequency f_low is about 20 MHz, which is well above 0 Hz. This means that CCO 65 can maintain oscillating even if PMOS transistor P1 is turned off. Therefore, both design requirements are satisfied.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A phase-locked loop (PLL) circuit comprising:
    a voltage-controlled oscillator (VCO) comprising:
        a voltage input node having an input voltage;
        a start-up circuit comprising a first current path having a first current and configured so that the first current increases in response to a decrease in the input voltage and decreases in response to an increase in the input voltage;
        a second current path having a second current and configured so that the second current decreases in response to the decrease in the input voltage and increases in response to the increase in the input voltage;
        a third current path combining a first proportion of the first current and a second proportion of the second current into a combined current; and
        a current-controlled oscillator (CCO) comprising an input receiving the combined current and outputting an AC signal.

2. The PLL circuit of claim 1, wherein the first current path comprises a PMOS transistor having a gate connected to the voltage input node, and wherein the first current flows through a source-drain path of the PMOS transistor.

3. The PLL circuit of claim 2, wherein the first current path further comprises a resistor serially connected to the source-drain path of the PMOS transistor.

4. The PLL circuit of claim 1, wherein the second current path comprises a first NMOS transistor having a gate connected to the voltage input node, and wherein the second current flows through a source-drain path of the first NMOS transistor.

5. The PLL circuit of claim 4, wherein the first current path further comprises a second NMOS transistor comprising a drain coupled to a drain of the first PMOS transistor, and wherein the PLL circuit further comprises a third NMOS transistor comprising a gate coupled to a gate and the drain of the second NMOS transistor, and a drain coupled to a drain of the first NMOS transistor.

6. The PLL circuit of claim 1 further comprising a loop filter comprising an output node coupled to the voltage input node of the VCO.

7. The PLL circuit of claim 1 further comprising:
    a phase frequency detector (PFD) having a first input for receiving a signal from outside the PLL circuit, a second input, and an output;
    a pump having an input coupled to the output of the PFD and an output coupled to an input node of the loop filter; and
    a feedback divider having an input coupled to an output of the CCO and an output coupled to the second input of the PFD.

8. The PLL circuit of claim 7, wherein the PLL circuit is free from an additional start-up circuit directly connected to the first input of the PFD.

9. The PLL circuit of claim 1, wherein the VCO is configured so that a frequency of the output signal is greater than zero Hz when the second current is substantially equal to zero.

10. The PLL circuit of claim 1, wherein the combined current is substantially equal to a summation of the first current and the second current.

11. A phase-locked loop (PLL) circuit comprising:
a first input node;
a first output node;
a loop filter comprising a second output node;
a start-up circuit comprising:
- a first current path comprising a first PMOS transistor, wherein a gate of the first PMOS transistor is coupled to the second output node; and
- a second current path mirroring a current in the first current path;
a third current path comprising a first NMOS transistor having a gate coupled to the second output node, wherein the second current path and the third current path are connected in parallel;
a fourth current path serially connected to the second current path and the third current path;
a fifth current path mirroring a current of the fourth current path; and
a current-controlled oscillator (CCO) comprising a second input node receiving a current of the fifth current path.

12. The PLL circuit of claim 11, wherein the CCO further comprises a third output node directly connected to the first output node of the PLL circuit.

13. The PLL circuit of claim 11, wherein the first current path further comprises a second NMOS transistor comprising a drain coupled to a drain of the first PMOS transistor, and wherein the second current path comprises a third NMOS transistor comprising a gate coupled to a gate and the drain of the second NMOS transistor, and a drain coupled to a drain of the first NMOS transistor.

14. The PLL circuit of claim 11, wherein a drain of the first NMOS transistor is coupled to a drain of a second PMOS transistor, and wherein the fifth current path comprises a third PMOS transistor comprising a gate coupled to a gate and the drain of the second PMOS transistor, a drain coupled to the second input node of the CCO, and a source coupled to a power supply node.

15. The PLL circuit of claim 11, wherein the first current path further comprises a resistor serially connected to a source-drain path of the first PMOS transistor.

16. A phase-locked loop (PLL) circuit comprising:
a first PMOS transistor comprising a first gate, a first drain, and a first source;
a first NMOS transistor comprising a second gate coupled to the first gate, a second drain, and a second source;
a second NMOS transistor comprising a third gate, a third drain coupled to the first drain and the third gate, and a third source coupled to a ground;
a third NMOS transistor comprising a fourth gate coupled to the third gate, a fourth drain, and a fourth source coupled to the ground;
a second PMOS transistor comprising a fifth gate, a fifth drain coupled to the fifth gate and the second drain, and a fifth source coupled to a power supply node;
a third PMOS transistor comprising a sixth gate coupled to the fifth gate, a sixth drain, and a sixth source coupled to the power supply node; and
a current-controlled oscillator (CCO) comprising an input node coupled to the sixth drain.

17. The PLL circuit of claim 16, wherein the fourth drain is directly connected to the second drain.

18. The PLL circuit of claim 16 further comprising a resistor coupled serially with a source/drain path of the first PMOS transistor.

19. The PLL circuit of claim 16 further comprising a feedback loop circuit receiving an output from the CCO and feeding back a voltage to the first gate and the second gate.

* * * * *